United States Patent [19]

Tenhover

[11] Patent Number: 4,861,751

[45] Date of Patent: Aug. 29, 1989

[54] PRODUCTION OF HIGH TEMPERATURE SUPERCONDUCTING MATERIALS

[75] Inventor: Michael A. Tenhover, Solon, Ohio

[73] Assignee: Standard Oil Company, Cleveland, Ohio

[21] Appl. No.: 76,586

[22] Filed: Jul. 23, 1987

[51] Int. Cl.$^4$ .................. C23C 8/06; B22D 11/00; B05D 5/12

[52] U.S. Cl. ........................... 505/1; 164/463; 427/62

[58] Field of Search .............. 505/1; 427/62; 148/6.3; 164/462, 463

[56] References Cited

U.S. PATENT DOCUMENTS 4,221,257  9/1980  Narasimhan ..................... 164/87
4,585,696  4/1986  Dustmann et al. ................ 428/375

FOREIGN PATENT DOCUMENTS 0285960  10/1988  European Pat. Off. .
0290357  11/1988  European Pat. Off. .
3715623  11/1988  Fed. Rep. of Germany .
3817319  12/1988  Fed. Rep. of Germany .
63-266716  11/1988  Japan .
63-279518  11/1988  Japan .

OTHER PUBLICATIONS

Matsuzaki et al., *Jap. J. of App Phys Let.*, vol. 26, No. 4, Apr. 1987, pp. L334–L336.

Gruen et al., *J. Electrochemical Soc.*, vol. 134, No. 6, Jun., 1987, pp. 1588–1589.

Wilson, M. N., "Practical Superconducting Materials", *Superconductor Materials Science*, Foner & Schwartz ed., Plenum Press (1981), pp. 63–131.

ER-RAKHO et al., "A Series of Oxygen Defect Perovskites Containing $Cu^{II}$ and $Cu^{III}$", Journal of Solid State Chemistry 37 (1981), pp. 151–156.

Millman, H., "Fabrication Technology of Superconducting Material", *Superconductor Materials Science*, Foner & Schwartz ed., Plenum Press (1981), pp. 275–388.

Tenhover, M., "High Critical Currents Obtained by Heat-Treating Rapidly Quenched HF-ZR-V Metallic Glasses", *IEEE Transaction on Magnetics*, vol. Mag 17, No. 1, Jan. 1981, pp. 1021–1024.

Wessel et al., "Scientists at Mit Report Fabricating Superconductors Using Metal Alloys", *Wall Street Journal*, Jun. 11, 1987, (page not known).

Robinson, A. L., "A New Route to Oxide Superconductors", *Science*, vol. 236, (Jun. 19, 1987), p. 1526.

Japan Ceramic News, vol. 1, No. 6, p. 3, Jun. 10, 1987 (Best copy).

Murphy, D. W. et al., "New Superconducting Cuprate Perovskites", *Physical Review Letters*, vol. 58, No. 18, May 4, 1987, pp. 1888–1890.

Kitazawa, K. et al., "Superconductivity at 95K in the New Yb-Ba-Cu Oxide System", *Japanese Journal of Applied Physics*, vol. 26, No. 4, Apr., 1987, pp. L339–L341.

Hikami, S. et al., "High Tc Magnetic Superconductor: Ho–Ba–Cu Oxide", *Japanese Journal of Applied Physics*, vol. 26, No. 4, Apr. 1987, pp. L347–L348.

Hosoya, S. et al., (I) "High-Tc Superconductivity in New Oxide Systems", *Japanese Journal of Applied Physics*, vol. 26, No. 4, Apr. 1987, pp. L325–L326.

(List continued on next page.)

Primary Examiner—Norman Morgenstern
Assistant Examiner—Margaret Bueker
Attorney, Agent, or Firm—Joseph G. Curatolo; Larry W. Evans; George W. Moxon

[57] ABSTRACT

A process is provided for the production of superconducting wires, ribbons, tapes, fibers and the like including the steps of forming an amorphous metal alloy containing at least one of scandium, yttrium or the rare earths; copper; and at least one alkaline earth as an elongated body, and reacting the amorphous metal alloy with oxygen at a temperature below the crystallization temperature of the alloy to form a sheath of superconducting oxide exterior to a core of amorphous metal alloy. Included in the invention are the elongated bodies thus produced and superconductor devices fabricated from said bodies.

24 Claims, 1 Drawing Sheet

OTHER PUBLICATIONS

Hosoya, S. et al., (II) "High-Tc Superconductivity in New Oxide Systems II", Japanese Journal of Applied Physics, vol. 26, No. 4, Apr. 1987, pp. L456–L457.

Hor, P. H. et al., "Superconductivity Above 90K in the Square Planar Compound System A $Ba_2Cu_3O_6+x$ ...", Physical Review Letters, vol. 58, No. 18, May 4, 1987, pp. 1891–1894.

Capone, D. W. et al., "Upper Critical Fields and High Superconducting Transition Temperatures ...", Applied Physical Letters, vol. 50, No. 9, Mar. 2, 1987, pp. 543–544.

Aeppli, G. et al., "Magnetic Penetration Depth and Flux-Pinning Effects in High-$T_c$ Superconductor $La_{1.85}Sr_{0.15}CuO_4$", Physical Review B, vol. 35, No. 13, May 1, 1987, pp. 7129–7132.

Chu, C. W. et al., "Superconductivity at 52.52K in the La–Ba–Cu–O System", Science, vol. 235, Jan. 30, 1987, pp. 567–569.

Bednorz, J. G. et al., "Superconductivity in Alkaline Earth-Substituted $LA_2CuO_{x-y}$", Science, vol. 236, Apr. 3, 1987, pp. 73–75.

Grant, P. M. et al., "Superconductivity Above 90K in the Compound $YBa_2Cu_3O_x$. . . ", Physical Review B, vol. 35, No. 13, May 1, 1987, pp. 7242–7244.

Gubser, D. U., "Superconducting Phase Transitions in the LA–M–Cu–O Layered Perovskite System . . . ", Physical Review B, vol. 35, No. 10, Apr. 1, 1987, pp. 5350–5352.

Hirabayash, M. et al., "Structure and Superconductivity in a New Type of Oxygen Deficient Perovskites $Y_1BA_2Cu_3O_7$", Japanese Journal of Applied Physics, vol. 26, No. 4, Apr. 1987, pp. L454–L455.

Tarascon, J. M. et al., "Superconductivity at 40K in the O–Defect Perovskites $LA_{2-x}SR_xCuO_{4-y}$", Science, vol. 235, Mar. 13, 1987, pp. 1373–1376.

PRODUCTION OF HIGH TEMPERATURE SUPERCONDUCTING MATERIALS

FIELD OF THE INVENTION

The present invention relates to the production of superconducting materials. More specifically, it relates to a process for producing high temperature superconducting oxides in a form having improved ductility sufficient to permit their fabrication into superconducting devices.

BACKGROUND OF THE INVENTION

It has been known for many years that a number of elements, alloys, and compounds when cooled below a critical temperature, the superconducting transition temperature $T_c$, enter into a zero electrical resistance state. This state of matter is one of the most interesting and potentially important states that occurs in nature. When matter is in the superconducting state it exhibits a variety of both classical and quantum mechanical phenomena. Of greatest technical interest is the ability of a superconductor to carry large amounts of current without energy loss and thereby generate large magnetic fields at less power than conventional conductors such as copper.

A superconducting material is characterized by its superconducting transition temperature ($T_c$—below which the material is superconducting and above which it is a normal conductor), upper critical magnetic field ($H_{c2}$—below which the material is in the superconducting state and above which it is a normal conductor), and critical current ($J_c$—below which it is a superconductor and above which it is normal conductor). Of these, the $T_c$ and $H_{c2}$ are dependent on the actual superconducting element, alloy, or compound while the critical current depends on both the superconducting element, alloy, or compound and the form of the material (single phase, multi-phase, composite structure). The dependence of the critical current on the microstructure of the material results from the need to pin the magnetic flux vortices that form in superconductors in the presence of a magnetic field. The phenomena is described in Wilson, M. N. "Practical Superconducting Materials", *Superconductor Materials Science*, Foner, S. and Schwartz, B. ed., Plenum Press (1981), pp. 63–131.

Important applications for superconducting materials include high field magnets, magnetic separation, magnetic levitation, electrical power transmission, electric motors, electrical generation, energy storage devices, and potentially, magnetically confined nuclear fusion. One of the major drawbacks to the widespread use of superconductors has been that the transition temperature, $T_c$, has been limited to about 20 K.

A new class of superconductors known as high temperature oxide superconductors have recently been discovered, in which the transition temperature is generally above about 40 K., and in some above 77 K., the boiling point of liquid nitrogen. The basic structure and components of these perovskite materials have been known since 1980 and are described in Er-Rakho, L. et al. "A Series of Oxygen-Defect Perovskites Containing $Cu^{II}$ and $Cu^{III}$", *Journal of Solid State Chemistry*, 37 (1981) pp. 151–156, but their superconducting characteristics have only recently been discovered. The materials are oxygen-defective perovskites containing both $Cu^{2+}$ and $Cu^{3+}$ in the same lattice, generally comprising rare earth-copper-alkaline earth-oxygen. Specific examples of the new class of superconductors include but are not limited to $Y_1Cu_2Ba_3O_x$, $Ba_{0.15}La_{1.85}CuO_x$, $Y_{0.5}Eu_{0.5}Cu_2Ba_3O_x$, $Sr_{0.15}La_{1.85}CuO_x$ and $Er_{0.2}Y_{0.8}Cu_2Ba_3Oa_x$. Others are listed in Table I, below.

The oxide materials have such high transition temperatures and high critical magnetic fields that they may lead to a revolutionary change in a number of industries, primarily those dealing with energy, electrical equipment, and transportation. However, a serious problem exists concerning these new materials in that being oxides, they are characteristically brittle and difficult, if not impossible, to form directly into useful components such as wires, ribbons, tapes, fibers or composites for fabrication of superconducting devices.

The requirements for using superconductors in a practical manner are summarized in Millman "Fabrication Technology of Superconducting Material," *Superconductor Materials Science*, Foner, S. and Schwartz, B. ed., Plenum Press (1981), pp. 275–388. These can be divided into (i) intrinsic properties of the superconducting phases and (ii) mechanical/physical properties that would allow for manufacturing of superconducting devices. The intrinsic properties that are important are the $T_c$, $H_{c2}$, and $J_c$. The mechanical/physical properties that are essential are: high strength and ductility, ability to make continuous wire/filaments/tapes, and good thermal conductivity.

A variety of methods have formerly been developed that allow the practical use of superconducting materials. For many applications, such as electromagnets, the desired form of the structural material used is a wire with sufficient mechanical strength and length to be susceptible to being wound into a tight coil. Superconductors do not generally possess the characteristic mechanical properties to be directly used in such applications and thus different solutions to this problem have been devised depending on the type of superconductor that is being used.

In the past, two types of materials were developed to meet the demanding requirements for use in high current, high magnetic field devices. The first materials were solid solution alloys such as NbTi (having $T_c$ equal to 8–10 K., and $H_{c2}$ equal to 14–15 tesla at 4.2 K.) in which the Nb and Ti atoms form a random body-centered cubic lattice. These materials have limited ductility and as described by Millman, supra, can be co-extruded with copper to form useful superconducting wires. The second materials were the A-15 structure materials such as Nb3Sn (having $T_c$ equal to 18.1 K. and $H_{c2}$ equal to 22.0 tesla at 4.2 K.). These materials are intrinsically brittle and their use has been primarily in the form of wires consisting of thin filaments of Nb3Sn in a copper matrix, Millman, supra. In both of these examples the cooper provides mechanical strength, ductility, and thermal conductivity to the wire.

A number of other metallic superconducting materials are known such as Nb3Al, (Hf-Zr)V2 and NbN, but are not commercially used today becuase no practical solution to the processibility problems mentioned above has been discovered. One proposal to solve mechanical processibility problems in the Hf-Zr-V alloy system has been to utilize a three step process, Tenhover, M., *IEEE Transaction on Magnetics*, Vol. Mag 17, No. 1, January 1981, pp. 1021–1024. Tenhover proposed to (i) melt spin a Hf-Zr-V alloy to form an amorphous metal alloy in the shape of a continuous ribbon, (ii) wind a coil to make an electromagnetic solenoid, and (iii) crystallize the amorphous Hf-Zr-V alloy to form the C-15 type superconducting compound $(Hf-Zr)V_2$.

A process for the production of high temperature oxide superconductors in a manner to compensate for their brittleness is also required.

SUMMARY OF THE INVENTION

It is an object of the present invention to provide a process for the production of high temperature oxide superconductors.

It is a further object of the present invention to provide a process for the production of high temperature oxide superconductors in a form suitable for use in fabricating superconducting devices.

It is a further object of the present invention to provide a process for the production of high temperature oxide superconductors in a flexible, ductile form such as wires, ribbons, tapes, fibers and composites including these structural bodies.

In general, the process of the present invention includes the formation of an elongated body of amorphous material comprising the non-oxygen elements to be included in the superconducting oxide, e.g. in the form of wires, ribbons, tapes, fibers or the like. The elongated body is reacted with oxygen under conditions which result in the formation of an outer, preferably continuous, sheath of oxide material surrounding an amorphous metal core. In correct proportions of amorphous material to oxide material, the flexibility and ductility of the amorphous metal component of the body permit fabrication into useful superconducting devices.

The present invention includes the flexible, ductile elongated bodies produced by the process described above, structural materials such as metal matrix composites in which the elongated bodies are incorporated, and superconducting devices fabricated from the elongated bodies or the incorporating structural materials.

DETAILED DESCRIPTION OF THE INVENTION

Figure 1:
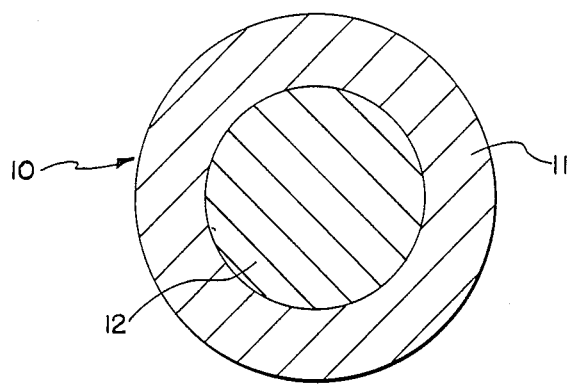
FIG. 1 is a cross-section of a wire or fiber produced from the process of the present invention.

According to the process of the present invention, an elongated body of amorphous metal material is formed. The elongated body can be shaped into the form desired, such as a wire, ribbon, tape, fiber or the like. In the specification and claims, the word "wire" will be used to denote the elongated body, but it is intended that other forms as stated above are included. The body or wire contains an amorphous metal alloy of the elements (excluding oxygen except in trace amounts) which are to be included in the superconducting oxide.

The first metallic component of the alloy is at least one rare earth, preferably at least one of La, Pr, Nd, Eu, Gd, Tb, Dy, Ho, Er, Tm, Yb, Lu, Y and Sc. For purposes of forming superconducting oxides, Sc and Y are considered to be rare earths and are thusly incorporated in the genus in this specification. Most preferably, the rare earth used is Y, La, Eu or Gd. Mixtures of rare earths are suitable, such as Eu and Y, Eu and Pr, or Y and La. A commercially available mixture of rare earths is didymium (Di).

The second metallic component is copper, and the third metallic component is at least one alkaline earth such as Mg, Ca, Sr and Ba, preferably Ba or Sr. Additional elements may be included for the purpose of providing particular characteristics to the finished or an intermediate product, so long as the inclusion of any such element does not prevent the formation of the superconducting metal oxide.

The amorphous metal alloy wire is formed preferably by known rapid solidification technology such as melt spinning or melt dragging. In these processes, a jet or a meniscus of a melt containing the desired elements for forming the amorphous metal alloy impinges on a chill block wheel. The shape of the nozzle from which the jet or meniscus is formed determines the roundness (wire) or flatness (tape or ribbon) of the elongated body formed, and the surface of the wheel determines whether long continuous strands or short fibers are formed.

The melt is formed by heating a mixture of the desired components at a temperature about 50°-100° C. above the melting point of the mixture. For example, the elements desired to be alloyed are mixed, or elements and metallic compounds of the desired components (such as $YCu+2Ba+2Cu$) are mixed to yield the alloy (such as $YBa_2Cu_3$) upon proper heating. The temperature used depends upon the components utilized, that is, it varies with the rare earth and the amount of alkaline earth used. Generally, the temperatures utilized are within the range of about 700° C. to about 1200° C. For a yttrium-copper-barium mixture, a temperature of about 800° C. is suitable.

The melt is spun or dragged in a vacuum or an inert atmosphere to prevent premature oxidation and crystallization of the alloy. The chill wheel is operated at a surface velocity of greater than or equal to about 200 to about 1000 meters/minute. A suitable chill wheel is copper, used for its thermal conductivity to permit rapid cooling and solidification of the amorphous metal alloy.

The body formed, wire, ribbon, or the like, should have a thickness of about 25-100 microns, preferably about 50 microns, and if in ribbon form, a width preferably of about 0.25 to 25 millimeters, although widths of up to one meter can be achieved by melt spinning. The length of the body is varied according to its intended use. The resulting body is ductile and flexible, and can be wound on a take-up wheel or otherwise handled for further processing.

According to the process of the present invention, the outer portion of the amorphous metal alloy wire is converted to a high temperature superconducting oxide. The wire, in a loose, tensioned or wound form is reacted with oxygen at a temperature below the crystallization temperature of the amorphous metal alloy under conditions sufficient to form a superconducting ceramic metal oxide outer sheath while retaining an amorphous metal core.

Because the outer oxide sheath is derived from the precursor amorphous metal alloy core, no binders or interlayer is required to adhere the core and sheath.

The superconducting oxide contains metal components in amounts proportional to the composition of the precursor amorphous metal alloy. The materials are oxygen-defective, however, and the amount of oxygen contained is less than that required for full oxidation of the metal species. As the exact proportion of oxygen is not readily determinable for any such composition, the proportion of oxygen is denoted by "x".

FIG. 1 is a cross-section of a wire 10 produced according to the process of the present invention. The outer sheath 11 comprises up to 25% of the cross-sectional area of the wire. The amorphous metal core 12 is retained.

Figure 2:
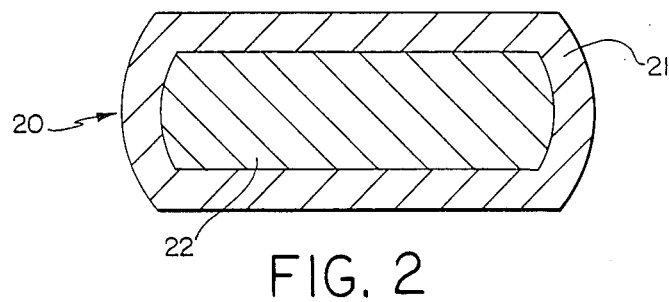
FIG. 2 is a cross-section of a ribbon or tape produced by the process of the present invention.

FIG. 2 shows a ribbon or tape 20 produced according to the process of the present invention. Again, an outer sheath 21 of superconducting metal oxide comprises up to 25% of the cross-sectional area of the ribbon or tape, and an amorphous metal alloy core 22 is retained.

Oxidation of the amorphous metal alloy wire can be carried out by heating in an oxygen-containing gas such as air, but preferred is an oxygen atmosphere. Alternatively, the surface of the amorphous metal alloy wire can be oxidized by rf- or dc-plasma-enhanced oxidation, utilizing the wire as one electrode in a plasma vacuum chamber and striking a plasma in about 10–100 mTorr of oxygen.

A further alternative is electrochemical oxidation in which the amorphous metal alloy wire is used as one electrode in an electrolytic solution such as buffered sulfuric acid (pH=6) with an inert counter electrode such as platinum. For example, a voltage of 2 volts is applied at an initial current of 20 milliamps for ten minutes to effect the oxidation.

It should be appreciated that the use of a crystalline precursor metal wire will not lead to a flexible, ductile superconducting metal oxide wire because of the formation of intermetallic compounds such as Y/Cu or Cu/Ba during the alloying process. This problem is avoided with the use of amorphous metal alloys as the precursor wire.

Although it is preferred that the oxide outer sheath be continuous, surrounding the amorphous metal alloy core, there may be some applications in which this is unnecessary or not desired.

Nevertheless, the structures shown in FIGS. 1 and 2 having a surface layer of superconducting metal oxide and an amorphous metal core should provide an excellent means of flux pinning due to the oxide-metal interface. The surface-superconductor/core-thermal conductor structure is advantageous to carry away any heat that might be generated by any localized electrical resistance experienced by the structure. Further, the stress developed upon oxidation may lead to high critical temperatures or better mechanical behavior such as compressive stress due to the mismatch of thermal expansion characteristics of the oxide and amorphous metal portions.

SPECIFIC EMBODIMENTS OF THE INVENTION

EXAMPLE 1

A Y-Ba-Cu alloy is melt spun to form a homogeneous amorphous metal alloy having excellent ductility and workability. This ribbon is oxidized in a furnace at 375° C. for 14 hours to form a mixed metal oxide surface of Y-Ba-Cu-O. Because the core remains a ductile amorphous metal, the composite structure will have sufficient mechanical properties to be used as a wire in applications requiring a high temperature superconductor.

EXAMPLE 2

Elemental powders Ho, Ba, and Cu are mixed together and pressed into a pellet. This pellet is heated in an argon atmosphere to its melting point to form a metallic alloy of composition $Ho_{0.25}Ba_{0.34}Cu_{1.0}$. This alloy is then melt spun to form a ribbon approximately 25 microns thick and 1 mm wide. The ductile amorphous metal ribbon is then drawn by extrusion/rolling to form filaments approximately 10 microns thick and 0.5 mm wide. These filaments are woven together to form a free standing mesh of material 5 cm thick and 10 cm wide. This assembly is oxidized in a furnace in air at 390° C. for 10 hours to form a mixed metal oxide surface on the filaments. This structure will find use when cooled to less than 90 K. as an efficient shield of electromagnetic radiation.

EXAMPLE 3

Tm and Cu are alloyed to form the intermetallic compound TmCu by melting at 1000° C. in an induction furnace. This alloy is then further alloyed with Ba and additional Cu to form the metallic alloy $Tm_{0.5}Ba_{0.5}Cu_1$. The resulting ingot is crushed and pieces are inserted into a fused silica crucible of a melt spinning system. Operating in an argon atmosphere, the alloy is inductively melted and projected onto the surface of a 4 inch diameter rotating (2000 rpm) copper wheel. The resulting ribbon is then placed into a plasma reactor in which the ribbon is in contact with one of the electrodes of an rf plasma system. This chamber is evacuated and refilled with 10 microns of oxygen. A plasma is set-up in the chamber at 100 watts for 20 minutes to form the superconducting metal oxide surface. At this point approximately 5–10% of the sample has been converted to the oxide phase and the ribbon has excellent mechanical properties.

Further illustrations of superconducting oxides having transition temperatures greater than about 40 K. which may be formed into wires according to the process of the present invention are listed below in Table I. Listed in the table are non-oxygen elements only, in their nominal amounts, with oxygen being a further component in the level necessary to impart superconductivity characteristics to the oxide formed.

TABLE I

| NON OXYGEN ELEMENTS OF SUPERCONDUCTING OXIDES | |
|---|---|
| $Y_1Ba_2Cu_3$ | $Ho_{1.8}Sr_{.2}Cu_1$ |
| $Eu_1Ba_{0.34}Cu_3$ | $Er_{0.5}Ba_{0.5}Cu_1$ |
| $Eu_1Ba_{2.1}Cu_3$ | $Lu_{0..7}Ba_{0.3}Cu_1$ |
| $La_1Ba_2Cu_3$ | $Tm_{0.5}Ba_{0.5}Cu_1$ |
| $La_{1.2}Ba_{1.8}Cu_3$ | $Dy_{0.5}Ba_{0.5}Cu_1$ |
| $La_1Ba_1Ca_1Cu_3$ | $Eu_{0.5}Ba_{0.5}Cu_1$ |
| $Y_1Ba_1Ca_1Cu_3$ | $La_1Ba_2Cu_3$ |
| $Y_{0.75}Sc_{0.25}Ba_2Cu_3$ | $Nd_1Ba_2Cu_3$ |
| $Eu_{0.75}Sc_{0.25}Ba_2Cu_3$ | $Sm_1Ba_2Cu_3$ |
| $Y_{0.5}La_{0.5}Ba_2Cu_3$ | $Gd_1Ba_2Cu_3$ |
| $Y_1Ba_{1.5}Sr_{0.5}Cu_3$ | $Ho_1Ba_2Cu_3$ |
| $Eu_{0.9}Pr_{0.1}Ba_2Cu_3$ | $Er_1Ba_2Cu_3$ |
| $Eu_{0.9}Y_{0.1}Ba_2Cu_3$ | $Lu_1Ba_2Cu_3$ |
| $Eu_{0.75}Y_{0.25}Ba_2Cu_3$ | $Y_{1.2}Ba_{0.8}Cu_1$ |
| $(Yb_{0.47}Ba_{0.53})_3Cu_2$ | $Lu_{1.8}Ba_{0.2}Cu_1$ |
| $Ho_{0.25}Ba_{0.34}Cu_1$ | $La_{1.85}Ba_{0.15}Cu_1$ |
| $Ho_{0.32}Ba_{0.34}Cu_1$ | $La_{1.85}Sr_{0.15}Cu_1$ |
| $(Yb_{0.9}Ba_{0.1})_2Cu$ | $Eu_1Ba_{0.5}Sr_{0.5}Cu_3$ |
| $(Lu_{0.9}Ba_{0.1})_2Cu$ | $Y_{0.5}Gd_{0.5}Ba_2Cu_3$ |
| $[(Yb_{0.9}La_{0.1})_{0.9}(Ba_{0.9}Sr_{0.1})_{0.1}]_2Cu$ | $Eu_1Ba_1Ca_{0.5}Sr_{0.5}Cu_3$ |
| $Er_{0.2}Y_{0.8}Ba_3Cu_2$ | $Y_{0.5}Eu_{0.5}Ba_3Cu_2$ |

Bodies or wires produced according to the process of the present invention including the superconducting oxide outer layer/amorphous metal alloy core will exhibit a bending diameter and sufficient strength, flexibility and ductility to permit fabrication into superconducting devices. The structure of the elongated bodies of the present invention will permit good thermal conductivity. Required intrinsic properties of $T_c$, $H_{c2}$ and $J_c$ are retained. Fibers prepared according to the process of the present invention can be fabricated into mats which are used in forming metal matrix composites. Wires can be directly used to wind solenoids, or can be clad in metals such as copper, aluminum or silver, to form tapes for use in transmission lines and magnets.

Devices incorporating the superconductor structures of the present invention may include but are not limited to those which do not carry current, such as magnetic shielding, magnetic field sensors, magnetomechanical devices (switches) and those which do carry current, such as electrical transmission lines, magnets, induction motors, and electric generators. The devices according to the present invention may operate at temperatures above those now required for superconductor operation.

It is apparent that the inventive process accomplishes the objectives as described above. The foregoing examples of amorphous metal alloy and superconducting oxide compositions, rapid solidification and oxidation methods, reaction conditions and the like are meant to be illustrative of the inventive methods, and are not intended to limit the invention, which includes all modifications and variations that fall within the scope of the following claims and their equivalent embodiments.

I claim:

1. A process for the production of an elongated superconducting oxide body including the steps of: (a) forming an elongated body of amorphous material made by rapid solidification of a metal of non-oxygen elements to be included in said superconducting oxide, and (b) reacting said elongated body with oxygen at a temperature below the crystallization temperature of said amorphous material to form a sheath of superconducting oxide exterior to a core of amorphous material.

2. A process as in claim 1 wherein said elements include at least one of scandium, yttrium or the rare earths.

3. A process as in claim 1 wherein said elements includes copper.

4. A process as in claim 1 wherein said elements include at least one alkaline earth metal.

5. A process for the production of an elongated superconducting oxide body comprising at least one of scandium, yttrium or the rare earths; copper; and, at least one alkaline earth, including the steps of
    (a) forming an amorphous metal alloy by rapid solidification containing said at least one of scandium, yttrium or the rare earths; copper; and, at least one alkaline earth as an elongated body, and
    (b) reacting said amorphous metal alloy with oxygen at a temperature below the crystallization temperature of said amorphous metal alloy to form a sheath of superconducting oxide exterior to a core of said amorphous metal alloy.

6. A process as in claim 5 wherein said amorphous metal alloy is formed by melt spinning.

7. A process as in claim 5 wherein said amorphous metal alloy is formed by drag spinning.

8. A process for the production of a superconducting oxide body comprising at least one of scandium, yttrium or the rare earths; copper; and, at least one alkaline earth, including the steps of
    (a) melt spinning an amorphous metal alloy containing said at least one of scandium, yttrium or the rare earths; copper; and, at least one alkaline earth, and
    (b) reacting said amorphous metal alloy with oxygen at a temperature below the crystallization temperature of said amorphous metal alloy to form a superconducting oxide body having an amorphous metal core.

9. A process as in claim 2, 5 or 8 wherein at least one of scandium, yttrium or the rare earths are selected from the group consisting of Sc, Y, La, Pr, Nd, Eu, Gd, Tb, Dy, Ho, Er, Tm, Yb, Lu, didymium and mixtures thereof.

10. A process as in claim 2, 5 or 8 wherein at least one of scandium, yttrium or the rare earths are selected from Y, La, Eu, Gd, and mixtures thereof.

11. A process as in claim 9 wherein said mixture includes Eu and Y.

12. A process as in claim 9 wherein said mixture includes Eu and Pr.

13. A process as in claim 9 wherein said mixture includes Y and La.

14. A process as in claim 4, 5 or 8 wherein said alkaline earth is selected from Mg, Ca, Sr, Ba and mixtures thereof.

15. A process as in claim 4, 5 or 8 wherein said alkaline earth is selected from Sr, Ba and mixtures thereof.

16. A process as in claim 14 wherein said alkaline earth is barium.

17. A process as in claim 14 wherein said alkaline earth metal is strontium.

18. A process as in claim 1, 5 or 8 wherein said reaction with oxygen is conducted in air.

19. A process as in claim 1, 5 or 8 wherein said reaction with oxygen is conducted in an oxygen atmosphere.

20. A process as in claim 1, 5 or 8 wherein said reaction with oxygen is conducted by electrolysis.

21. A process as in claim 1, 5 or 8 wherein said reaction with oxygen is conducted in an oxygen plasma.

22. A process as in claim 1, 5 or 8 wherein said reaction with oxygen is conducted at a temperature of about 700° C. to about 1200° C.

23. A process as in claim 2, 5 or 8 wherein said superconducting oxide body contains yttrium.

24. A process as in claim 2, 5 or 8 wherein said superconducting oxide body contains Eu.

* * * * *